United States Patent
Harada et al.

(10) Patent No.: US 8,216,642 B2
(45) Date of Patent: Jul. 10, 2012

(54) METHOD OF MANUFACTURING FILM

(75) Inventors: Masamichi Harada, Susono (JP);
Narishi Gonohe, Susono (JP)

(73) Assignee: Ulvac, Inc., Chigasaki-Shi (JP)

( * ) Notice: Subject to any disclaimer, the term of this patent is extended or adjusted under 35 U.S.C. 154(b) by 219 days.

(21) Appl. No.: 11/710,918

(22) Filed: Feb. 27, 2007

(65) Prior Publication Data
US 2007/0178234 A1 Aug. 2, 2007

Related U.S. Application Data

(62) Division of application No. 10/989,541, filed on Nov. 17, 2004, now abandoned.

(30) Foreign Application Priority Data

Nov. 20, 2003 (JP) .................... 2003-390391
Dec. 1, 2003 (JP) .................... 2003-401195

(51) Int. Cl.
*C23C 16/18* (2006.01)
(52) U.S. Cl. .......... 427/250; 427/117; 427/294; 427/295
(58) Field of Classification Search .............. 427/248.1, 427/255.28, 117, 294, 295, 250
See application file for complete search history.

(56) References Cited

U.S. PATENT DOCUMENTS

| | | | |
|---|---|---|---|
| 5,421,973 A * | 6/1995 | Koo et al. ............... | 204/192.15 |
| 6,003,243 A | 12/1999 | Ohmi ....................... | 34/218 |
| 6,159,533 A * | 12/2000 | Dearnaley et al. ......... | 427/115 |
| 6,228,751 B1 | 5/2001 | Yamazaki et al. ......... | 438/585 |
| 6,232,142 B1 * | 5/2001 | Yasukawa ................. | 438/69 |
| 6,653,212 B1 * | 11/2003 | Yamanaka et al. ......... | 438/485 |
| 7,678,422 B2 * | 3/2010 | Lei et al. .................. | 427/255.29 |
| 7,785,658 B2 * | 8/2010 | Shinriki et al. ............ | 427/96.8 |
| 2002/0006711 A1 * | 1/2002 | Yamazaki et al. ......... | 438/471 |
| 2002/0019116 A1 * | 2/2002 | Sandhu et al. ............ | 438/478 |
| 2002/0164420 A1 * | 11/2002 | Derderian et al. ......... | 427/248.1 |

(Continued)

FOREIGN PATENT DOCUMENTS

JP 6-29245 2/1994
(Continued)

OTHER PUBLICATIONS

Miura, Hiroshi, "Preparation of supported bimetallic catalysts by means of selective deposition using mobile metal compounds as precursors". Catalysis Today 28 (1996), pp. 215-221.*

(Continued)

*Primary Examiner* — Bret Chen
(74) *Attorney, Agent, or Firm* — Kratz, Quintos & Hanson, LLP

(57) ABSTRACT

A technique that enables the formation of a low resistivity barrier film at low temperatures, in which a catalyst is placed inside a vacuum chamber and heated, a raw material gas and a reactive gas (such as $H_2$, $NH_3$ or $SiH_4$) are introduced alternately into the vacuum chamber, and a reaction is effected between the raw material gas adsorbed to the surface of an object, and radicals generated by decomposition of the reactive gas on contact with the catalyst, thereby depositing a thin film on the object. Furthermore, a technique for removal of impurities (such as oxides, fluorides, carbides or nitrides), in which the catalyst is placed in a vacuum atmosphere and heated, and a treatment gas having a hydrogen atom in its chemical structure is brought into contact with the catalyst, thereby generating radicals. The surface of an object to be treated is exposed to these radicals.

14 Claims, 9 Drawing Sheets

U.S. PATENT DOCUMENTS

| | | | |
|---|---|---|---|
| 2002/0193040 A1* | 12/2002 | Zhou | 445/51 |
| 2003/0082296 A1* | 5/2003 | Elers et al. | 427/96 |
| 2003/0082301 A1* | 5/2003 | Chen et al. | 427/255.28 |
| 2003/0161952 A1* | 8/2003 | Wang et al. | 427/255.392 |
| 2003/0190497 A1* | 10/2003 | Yang et al. | 428/698 |
| 2004/0007177 A1 | 1/2004 | Ohmi et al. | 118/715 |
| 2004/0127069 A1 | 7/2004 | Yamazaki et al. | 438/778 |
| 2004/0182316 A1* | 9/2004 | Watanabe | 118/715 |
| 2004/0256993 A1 | 12/2004 | Yamazaki et al. | 313/634 |
| 2005/0126030 A1 | 6/2005 | Ohmi et al. | 34/58 |
| 2005/0268852 A1* | 12/2005 | Hatanaka et al. | 118/723 VE |

FOREIGN PATENT DOCUMENTS

| | | |
|---|---|---|
| JP | 6-347620 | 12/1994 |
| JP | 2000-147233 | 5/2000 |
| JP | 2000-269163 | 9/2000 |
| JP | 2000-323571 | 11/2000 |
| JP | 2002-193981 | 7/2002 |
| JP | 2002-261010 | 9/2002 |
| JP | 2002-2895586 A | 10/2002 |
| JP | 2003-160872 | 6/2003 |

OTHER PUBLICATIONS

Yoshida, N., et al., "Effect of hydrogen on carbon deposition from carbon monoxide on nickel catalyst". Catalysis Letters 23 (1994) pp. 237-243.*

Zhang, Yiping, et al., "Catalyst Enhanced Chemical Vapor Deposition: Effects on Chemical Vapor Deposition Temperature and Film Purity". J. Am. Chem. Soc. 1997, 119, pp. 9295-9296.*

Office Action dated Oct. 12, 2007 of the corresponding Chinese Patent Appln. No. 200410095762.0 with English translation.

* cited by examiner

METHOD OF MANUFACTURING FILM

This application is a Divisional of prior application Ser. No. 10/989,541 filed on Nov. 17, 2004, now abandoned, the contents being incorporated herein by reference.

BACKGROUND OF THE INVENTION

1. Field of the Invention

A first aspect of the present invention relates to the formation of a thin film, and more particularly to a technique for forming a metal barrier film at low temperature.

A second aspect of the present invention relates to a method of forming a metal film in a semiconductor device, and more particularly to a cleaning technique used prior to the formation of a metal film on a metal surface or a Si surface.

2. Description of the Related Art

<First Aspect>

CVD apparatuses and sputtering apparatuses are typically used for forming thin films on the surfaces of semiconductor substrates.

A conventional method of manufacturing a thin film is described below, using a plasma CVD method as a specific example. The reference numeral 101 in FIG. 15 shows a conventional CVD apparatus.

This CVD apparatus 101 comprises a vacuum chamber 120, with a hot plate 121 positioned above the inside bottom surface of this vacuum chamber 120, and a high frequency electrode 122 positioned near the ceiling of the vacuum chamber 120.

Lift pins 124 are inserted inside the hot plate 121, and by activating these lift pins 124, an object to be treated can be mounted on the hot plate 121. The reference numeral 102 in FIG. 15 shows an object to be treated in this mounted state. This object 102 is heated using a heater provided within the hot plate 121.

A raw material gas supply system 127 and a high frequency power supply 126 are connected to the high frequency electrode 122. Shower nozzles 123 are provided in the bottom surface of the high frequency electrode 122, and the raw material gas, which is supplied from the raw material gas supply system 127 to the high frequency electrode 122, is sprayed into the vacuum chamber 120 through these shower nozzles 123.

If a high frequency voltage is then applied to the high frequency electrode 122 using the high frequency power supply 126, plasma of a raw material gas is generated, thereby enabling a thin film to be grown on the Si or metal surface of a semiconductor substrate.

However, the film formation method described above requires the object to be heated to a high temperature, and is consequently unsuitable for current low temperature processes.

Thin film formation methods under low temperature have been disclosed, but when these methods are used in the formation of metal wiring or metal barrier films, the resistivity of the produced films is undesirably high.

Patent Reference 1: Japanese Patent Laid-Open Publication No. 2000-269163.

Furthermore, in those cases where a copper film is partially exposed on the semiconductor substrate as the object, copper oxide and residual fluorine (F) and carbon (C) components have adhered on the surface of the copper film. during previous etching steps. If a metal barrier film is formed directly onto the surface of the Cu film in this state, it is difficult to achieve ohmic contact between the metal barrier film and the Cu.

In the conventional technology for cleaning step of the surface of the Cu film, hydrogen gas is introduced into the vacuum chamber and a high frequency (such as, RF) is applied to generate plasma. Then, the excited hydrogen ions are used to remove the insulating material comprising oxides, F components, and C components from the Cu surface. The surface of the Cu film to be treated is positioned at the bottom of fine holes (via holes). In a typical conventional example, the diameter of these holes is 0.13 μm, the depth of the holes is 0.85 μm, and the aspect ratio is 5 or more.

With the high aspect ratio, even if methods having good ion directivity into holes and grooves (such as, RIE (Reactive Ion Etching)) are used, it is known that access of the hydrogen ions into the holes is retarded by charge-up of the surface of the semiconductor substrate caused by ion impact.

On the other hand, for cleaning methods that do not use plasmas, removing the oxygen from copper oxides through a hydrogen reduction reaction are also known. However, in order to ensure an efficient reduction reaction, the substrate temperature must be at least 350° C. It is not suitable to require lower process temperatures in recent years.

<Second Aspect>

For example, copper oxide and residual fluorine (F) and carbon (C) components that have adhered during previous etching steps remain on the surface of a copper film exposed on a semiconductor substrate. If a metal barrier film is directly formed onto the surface of the Cu film in this state, it is difficult to achieve ohmic contact between the barrier metal and the Cu film.

In the conventional technology, hydrogen gas ions are introduced into the vacuum chamber and a high frequency (such as, RF) is applied to generate a plasma, so that the thus formed excited hydrogen ions are used to remove the insulating material comprising oxides, F components, and C components or the like from the Cu surface during a step for cleaning the surface of the Cu film.

The advantage of this method is that the cleaning step can be conducted at a comparatively low temperature of the substrate (200 to 300° C.) Such method is suitable for the requirement of lower process temperatures for semiconductor devices in recent years.

The surface of the Cu film to be treated is positioned at the bottom of fine holes (via holes). In a typical conventional example, the diameter of these holes is 0.13 μm, the depth of the holes is 0.85 μm, and the aspect ratio is 5 or more.

With the high aspect ratio, even if methods having good ion directivity into holes and grooves (such as, RIE (Reactive Ion Etching)) are used, it is known that access ofthe hydrogen ions into the holes is retarded by charge-up of the surface of the semiconductor substrate caused by ion impact.

In order to improve the efficiency of the treatment, either the high frequency power must be further strengthened, or the plasma density must be increased. However, the former case cause shaving of the patterning shape, whereas the latter case requires the introduction of complex and expensive systems (such as, ICP (Inductively Coupled Plasma) or ECR plasma).

Alternatively, cleaning methods without using plasmas, removing the oxygen from copper oxides through a hydrogen reduction reaction are also known.

However, in order to ensure an efficient reduction reaction, the substrate temperature must be at least 350° C. Such method is not suitable for the requirement of lower process temperatures in recent years. These methods may potentially be applied to the cleaning of the bottom portions of via holes in recent aluminum wiring processes and the cleaning of the Si surface in a transistor salicide process prior to Co or Ni sputtering.

Patent Reference 1: Japanese Patent Laid-Open Publication No. 2000-323571

Patent Reference 2: Japanese Patent Laid-Open Publication No. 2000-269163

SUMMARY OF THE INVENTION

The present invention has been developed to resolve the above problems-associated with the conventional technology, and an object of a first aspect of the present invention is to provide a technique for forming a low-resistance barrier film at low temperature.

Furthermore, an object of a second aspect of the present invention is to provide a technique that enables the cleaning of metal surfaces such as Si, Al, and TiN, and metal films such as Cu films, without requiring heating of the substrate of the object to high temperatures.

In order to achieve the above object, the first aspect of the present invention provides a method of manufacturing a thin film comprising performing a raw material gas introduction step and a reactive gas introduction step alternately so as to form a thin film on the surface of an object to be treated positioned inside a vacuum chamber, wherein a raw material gas introduction step is supplying raw material gas into a vacuum chamber, wherein a reactive gas introduction step is introducing a reactive gas including a hydrogen atom in its chemical structure into the vacuum chamber during the introduction of the raw material gas halted, and bringing the reactive gas into contact with a heated catalyst.

Furthermore, in the first aspect of the present invention, the present invention further comprises a step of a raw material gas evacuation step of evacuating the inside of the vacuum chamber during introduction of both the raw material gas and the reactive gas halted, and the step is provided after the above raw material gas introduction step., and prior to the reactive gas introduction step.

Furthermore, in the first aspect of the present invention, a reactive gas evacuation step of evacuating the inside of the vacuum chamber during introduction of both the raw material gas and the reactive gas halted, and the step is provided after the above reactive gas introduction step, prior to returning to the raw material gas introduction step.

Furthermore, in the first aspect of the present invention, the reactive gas can use one or more gases selected from the group consisting of $H_2$ gas, $NH_3$ gas, $SiH_4$ gas, $NH_2NH_2$ gas, and $H_2O$ gas.

Moreover, in the first aspect of the present invention, an organometallic compound gas can be used as the raw material gas.

Furthermore, in the first aspect of the present invention, a metal wiring film may be exposed on at least a part of the surface of the object, and a thin film is formed on the exposed metal wiring film.

Furthermore, in the first aspect of the present invention, an insulating film is disposed on the metal wiring film, and the aforementioned thin film then formed on the metal wiring film exposed at the bottom of a hole formed in the insulating film.

In addition, the first aspect of the present invention also provides a method of manufacturing a thin film in which a pretreatment step is conducted prior to the formation of the thin film, wherein the pretreatment step comprises the steps of positioning the object inside the vacuum chamber, and introducing the reactive gas into the vacuum chamber without introducing the raw material gas during the catalyst in a heated state, thereby bringing the reactive gas into contact with the catalyst.

The first aspect of the present invention also provides a method of manufacturing a semiconductor device, wherein the object is a semiconductor substrate, and a thin film is formed on the semiconductor substrate using one of the aforementioned methods of manufacturing a thin film.

Furthermore, the first aspect of the present invention also provides a semiconductor device comprising a thin film formed using one of the aforementioned methods of manufacturing a thin film.

As described above, the first aspect of the present invention comprises the steps of placing a catalyst comprising W or Ta or the like in a vacuum chamber, evacuating the vacuum chamber, and then heating the catalyst under vacuum to a temperature of 1,500 to 2,000° C.

The catalyst is ordinarily fine wiring with a diameter of approximately 0.5 mm, and may comprise either a single or a plurality, arranged either in parallel or in a mesh-like structure.

With the catalyst in this heated state, the reactive gas having a hydrogen atom in its chemical structure is introduced into the vacuum chamber, and reaction gas is decomposed by contact with the heated catalyst, thereby generating radicals.

For example, if the reactive gas is $H_2$ so that H atoms are generated, whereas if the reactive gas is $NH_3$ gas, then NH and $NH_2$ (represented by the general formula $NH_x$) are generated. H atoms, NH, and $NH_2$ are all radicals.

These radicals are extremely reactive, and have very powerful reductive abilities. Even if the substrate temperature is 200° C. or less, they readily reduce any impurities such as metal oxides, fluorides or carbides or the like on the surface of the metal thin film or the semiconductor, thereby enabling a clean metal thin film or semiconductor surface to be exposed. For example, if the impurity is oxide, the reduction is performed by deoxidization reaction.

Furthermore, if the raw material gas is introduced together with the reactive gas, the raw material gas reacts with the radicals, and forms a thin film on the surface of the object positioned inside the vacuum chamber.

Even if the reactive gas is introduced and converted to radicals after the introduction of the raw material gas, the raw material gas adsorbed to the surface of the object react and form a thin film.

If the steps of introducing the raw material gas and the reactive gas are conducted repeatedly, the thin film can be deposited.

The generation of radicals by introducing the reactive gas can also be used for cleaning the surface of the object. Particularly in those cases where the surface of a semiconductor or a metal thin film is exposed at the bottom of very fine grooves or holes formed in the insulating film of a semiconductor device. The radicals are ideal as they can easily reach at the bottom of such fine grooves or holes by diffusion. Even if the temperature of the object is 200° C. Or lower, the bottom surfaces of such fine grooves or holes can still be effectively cleaned.

In contrast, in techniques using plasma (such as, RIE), ions are generated by collisions between accelerated electrons and a raw material gas in three dimensional space, and these ions decompose oxides or the like.

Radicals (such as, H atoms or $NH_x$) are electrically neutral, so that they cause no charge-up of the object. In contrast, irradiation of ions onto the object causes charge-up of elements within the semiconductor substrate as the object; as a result, these elements are damaged.

Furthermore, ions also cause shaving of the insulating film; i.e., the pattern shape of the insulating film may sag. In addition, the efficiency of decomposition of oxides or the like by RACE is inferior to that offered by the method of the present invention (the decomposition efficiency for the present invention is supposed to be 10 to 100-fold that of plasma).

A second aspect of the present invention provides a cleaning method of a surface of a semiconductor substrate, comprising the steps of generating radicals by bringing a treatment gas having a hydrogen atom in its chemical structure into contact with a heated catalyst, and bringing the surface of an object into contact with the radicals, thereby reducing impurities positioned on at least a part of the surface of the object.

Furthermore, in the second aspect of the present invention, the treatment gas can use one or more gases selected from the group consisting of $H_2$ gas, $NH_3$ gas, $SiH_4$ gas, $NH_2NH_2$ gas, and $H_2O$ gas.

Moreover, in the second aspect of the present invention, a conductive material may be exposed on the surface of the object.

Furthermore, in the second aspect of the present invention, the treatment gas can use either a single gas selected from the group consisting of $H_2$ gas, $NH_3$ gas, $SiH_4$ gas, $NH_2NH_2$ gas, and $H_2O$ gas, or a mixed gas comprising two or more of these gases.

The second aspect of the present invention also provides a method of manufacturing a semiconductor device, comprising the steps of generating radicals by bringing a treatment gas having hydrogen atom in its chemical structure into contact with a heated catalyst, bringing a surface of a semiconductor substrate into contact with the radicals, thereby reducing impurities positioned on at least a portion of the surface of the semiconductor substrate, and forming a conductive material on at least the surface where the impurities have been reduced.

Furthermore, in this second aspect of the present invention, the treatment gas can use either a single gas selected from the group consisting of $H_2$ gas, $NH_3$ gas, $SiH_4$ gas, $NH_2NH_2$ gas, and $H_2O$ gas, or a mixed gas comprising two or more of these gases.

Furthermore, in the second aspect of the present invention, a conductive material patterned into predetermined shape exposed on at least a part of the surface of the semiconductor substrate is brought into contact with the radicals.

In addition, the second aspect of the present invention also provides a method of manufacturing a semiconductor device, wherein an insulating film is disposed on the aforementioned conductive material, and the conductive material is exposed at the bottom of a hole formed in the insulating film.

Furthermore, in the second aspect of the present invention, the conductive material can use a material selected from the group consisting of a copper thin film, a TiN thin film, an Al thin film, and a Si crystal.

The second aspect of the present invention is as described above, and involves the steps of evacuating atmosphere where a catalyst is positioned, placing the catalyst comprising W or Ta or the like in a vacuum atmosphere, and then heating the catalyst under vacuum to a temperature of 1,500 to 2,000° C. Then, a treatment gas having hydrogen atoms in its chemical structure is brought into contact with the heated catalyst, so that the treatment gas is decomposed to generate radicals. The catalyst is typically formed from fine wiring with a diameter of approximately 0.5 mm, and may comprise either a single or a plurality of wiring, arranged either in parallel or in a mesh-like structure.

For example, if the treatment gas is $H_2$ or $H_2O$, H atoms are generated. If the reactive gas is $NH_3$ gas, then NH and $NH_2$ (represented by the general formula $NH_x$) are generated. H atoms, NH, and $NH_2$ are all radicals.

These radicals are extremely reactive, and have very powerful reductive abilities. Even if the substrate temperature. is 200° C. or less. The radicals readily reduce any impurities (such as, metal oxides, fluorides or carbides or the like) on the surface of the metal thin film or the semiconductor, thereby enabling a clean metal film or semiconductor surface to be exposed. For example, if the impurity is oxide, the reduction is performed by deoxidization reaction.

The surface of the semiconductor or metal thin film is exposed at the bottom of very fine grooves or holes formed in an insulating film of the semiconductor device. The radicals can easily reach at the bottom of such fine grooves or holes by diffusion. Even if the temperature of the object is a 200° C. or lower, the bottom surfaces of such fine grooves or holes can still be effectively cleaned by the radicals.

In contrast, in techniques using plasma (such as, RIE), ions are generated by collisions in three dimensional space between accelerated electrons and a raw material gas, and these ions decompose oxides or the like.

Radicals (such as, H atoms or $NH_x$ radicals) are electrically neutral so that they cause no charge-up of the object. In contrast, ions carry an electrical charge so that the irradiation of ions onto the object causes charge-up, and as a result, elements within the semiconductor substrate are damaged.

Furthermore, ions also cause shaving of the insulating film so that the pattern shape of the insulating film may sag. The efficiency with which RIE decompose oxides or the like is inferior to that offered by the method of the present invention. RCE provides only 1/10th to 1/100th the efficiency of the present invention.

The present invention enables an object to be cleaned without requiring heating to a high temperature.

The present invention also enables cleaning of the bottom surfaces of grooves or holes with high aspect ratios.

Furthermore, the insulating film pattern does not collapse by using the present invention.

The method of the present invention is appropriate for cleaning the surfaces of semiconductor substrates and copper thin films, and can also be applied to the cleaning of non-copper surfaces (such as, TiN, Al, and Si).

DETAILED DESCRIPTION OF THE PREFERRED EMBODIMENTS

<Vacuum Treatment Apparatus>

Figure 1:
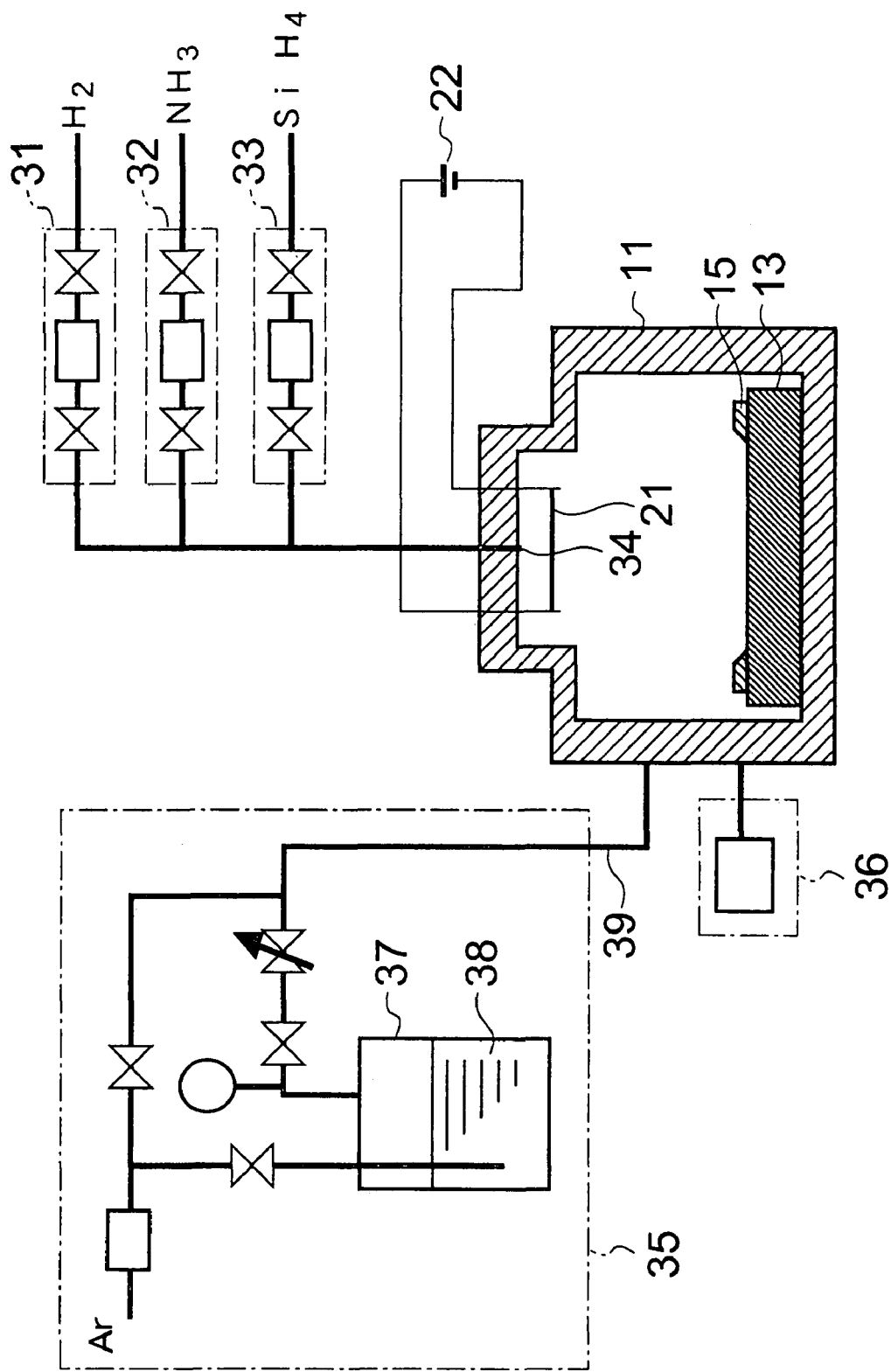
FIG. 1 is a vacuum apparatus that can be used in the first and second aspects of the present invention.

The reference numeral 10 in FIG. 1 denotes a vacuum treatment apparatus that can be used in both the first and second aspects of the present invention. The apparatus comprises a vacuum chamber 11, with a hot plate 13 disposed on the inside bottom wall of this vacuum chamber 11. Clamps 15 are provided at the periphery of the hot plate 13; and when an object for treatment is placed on the hot plate 13, the object is held by the clamps 15.

A catalyst 21 is also provided inside the vacuum chamber 11 in a position directly above the hot plate 13. This catalyst 21 is connected to a power supply 22. A direct current or an alternating current flows through the catalyst 21 by activating the power supply 22, thereby causing the catalyst 21 to be heated to a high temperature. In this embodiment, the catalyst 21 uses a tungsten wire of diameter $\phi$ 0.5 mm and length 300 mm or 340 mm.

A vacuum exhaust system 36 is connected to the vacuum chamber 11, and the inside of the vacuum chamber 11 is structured so as to provide a high vacuum atmosphere. Once the inside of the vacuum chamber 11 has reached a state of vacuum atmosphere, the catalyst 21 is energized and heated to a high temperature.

A gas inlet 34 is provided in the wall (the ceiling) of the vacuum chamber 11 in a position just above the catalyst 21. First through third gas supply systems 31 to 33 are positioned outside the vacuum chamber 11, and each of these gas supply systems 31 to 33 is connected to the gas inlet 34 respectively.

The gases used to fill the first through third gas supply systems 31 to 33 differ for the first and second aspects of the present invention.

<Apparatus for the First Aspect>

Each of the first through third gas supply systems 31 to 33 comprises a gas cylinder filled with a different reactive gas. In this embodiment, the gas cylinders of the first through third gas supply systems 31 to 33 are filled with the reactive gases $H_2$, $NH_3$, and $SiH_4$, respectively.

The vacuum treatment apparatus 10 is constructed so that a reactive gas from either one or a plurality of the first through third gas supply systems 31 to 33 can be introduced into the vacuum chamber 11 via the gas inlet 34 with the flow rate of the reactive gas controlled appropriately.

Figure 2:
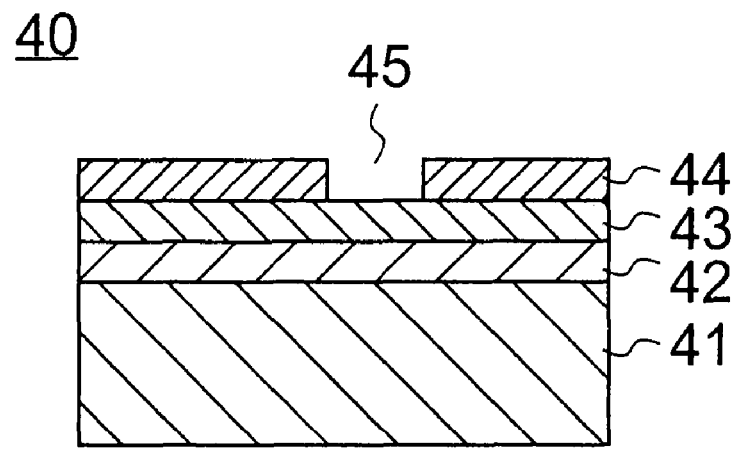
FIG. 2 is a cross-sectional view of the object to be treated for the first and second aspects of the present invention.

FIG. 2 is a schematic cross-sectional view showing an object to be treated 40 for use in the method of the present invention. This object 40 is a semiconductor substrate that is halfway through the semiconductor manufacturing process, and comprises a first insulating film 42, a metal wiring film 43, and a second insulating film 44 formed sequentially, in that order, on the surface of a silicon substrate 41. A groove or hole 45 is formed in the second insulating film 44, and the metal wiring film 43 is exposed at the bottom surface of this groove or hole 45. The metal wiring film 43 is typically a copper thin film that has been patterned into a predetermined planar shape. Portions of the metal wiring film 43 are connected to electrical elements formed on the silicon substrate 41.

The inside of the vacuum chamber 11 is evacuated to be vacuum atmosphere, and with this vacuum atmosphere maintained, an object 40 such as that described above is then transported into the vacuum chamber 11 and positioned on the hot plate 13 with the aforementioned groove or hole 45 facing the catalyst 21.

(Pretreatment)

A current is passed through the hot plate 13, and the object 40 is then placed on the hot plate 13 and heated to a temperature of 170 to 270° C.

The catalyst 21 is then energized and heated, and once the temperature has been raised to a predetermined temperature, a reactive gas is introduced from the first through third gas supply systems 31 to 33. In this embodiment, $H_2$ gas was introduced as the reactive gas from the first gas supply system 31.

The gas supply rate (flow rate) was set to 200 sccm, and by controlling the vacuum exhaust rate, the pressure inside the vacuum chamber 11 was set within a range from 0.8 to 65 Pa.

A tungsten wire of diameter 0.5 mm and length 300 mm is used as the catalyst 21. The power supplied to the catalyst 21 is set at a direct current voltage of 13.0 V and a current of 14.0 A, and the temperature of the catalyst 21 is raised to approximately 1700° C.

The reactive gas generates hydrogen radicals by contact with the catalyst 21, and these hydrogen radicals reduce the oxides on the surface of the metal wiring film 43 that is exposed at the bottom of the groove or hole 45 of the object 40, thereby enabling a clean copper thin film surface to be exposed.

In this embodiment, by supplying the reactive gas ($H_2$ gas) for a period of 60 seconds with the catalyst 21 maintained at high temperature, the oxides on the surface of the metal wiring film 43 at the bottom of the groove or hole 45 were removed.

Even if the reactive gas is altered to either solely $NH_3$ gas, solely $SiH_4$ gas, or a mixed gas comprising two or more gases selected from among $H_2$ gas, $NH_3$ gas, and $SiH_4$ gas, the oxides on the surface of the metal wiring film 43 at the bottom of the groove or hole 45 are able to be removed in a similar manner to that observed when $H_2$ gas was used as the reactive gas.

<Apparatus for the second Aspect>

Each of the first through third gas supply systems 31 to 33 comprises a gas cylinder filled with a different treatment gas. In this embodiment, the gas cylinders of the first through third gas supply systems 31 to 33 are filled with the treatment gases $H_2$, $NH_3$, and $SiH_4$, respectively.

The vacuum treatment apparatus 10 is constructed so that a treatment gas from either one, or a plurality of the first through third gas supply systems 31 to 33 can be introduced into the vacuum chamber 11 from the gas inlet 34 with the flow rate of the treatment gas controlled appropriately.

FIG. 2 is a schematic cross-sectional view showing an object to be treated 40 for use in the method of the present invention. This object 40 is a semiconductor substrate that is halfway through the semiconductor manufacturing process, and comprises a first insulating film 42, a metal wiring film 43, and a second insulating film 44 formed sequentially on the surface of a silicon substrate 41 in this order. A groove or hole 45 is formed in the second insulating film 44, and the metal wiring film 43 is exposed at the bottom of this groove or hole 45. The metal wiring film 43 is typically a copper thin film that has been patterned into a predetermined planar shape. Portions of the metal wiring film 43 are connected to electrical elements formed on the silicon substrate 41.

The inside of the vacuum chamber 11 is evacuated to a vacuum atmosphere, and with this vacuum atmosphere maintained, an object 40 such as that described above is then transported into the vacuum chamber 11 and positioned on the hot plate 13 with the aforementioned groove or hole 45 facing the catalyst 21.

A current is passed through the hot plate 13 in advance. The object 40 is then placed on the hot plate 13 and heated to a temperature of 170 to 270° C.

The catalyst 21 is then energized and heated, and once the temperature has been raised to a predetermined temperature, a treatment gas is introduced from the first through third gas supply systems 31 to 33. In this embodiment, $H_2$ gas was introduced as the treatment gas from the first gas supply system 31.

The gas supply rate (flow rate) was set to 200 sccm, and by controlling the vacuum exhaust rate, the pressure inside the vacuum chamber 11 was set within a range from 0.8 to 65 Pa.

The catalyst 21 uses a tungsten wire of diameter 0.5 mm and length 300 mm, and by outputting a direct current voltage of 11.0 V from the power supply 22, the current reached 11.0 A. Under these conditions, the temperature of the catalyst 21 reached approximately 1700° C.

On contact with the catalyst 21, the treatment gas generates hydrogen radicals, and these hydrogen radicals reduce the oxides on the surface of the metal wiring film 43 that is exposed at the bottom of the groove or hole 45 of the object 40, thereby enabling a clean copper thin film surface to be exposed.

In this embodiment, by supplying the treatment gas ($H_2$ gas) for a period of 60 seconds with the catalyst 21 maintained at high temperature, the oxides on the surface of the metal wiring film 43 at the bottom of the groove or hole 45 were removed.

Even if the treatment gas is altered to either solely $NH_3$ gas, solely $SiH_4$ gas, solely $H_2O$ gas, or a mixed gas comprising two or more gases selected from among $H_2$ gas, $NH_3$ gas, $SiH_4$ gas, and $H_2O$ gas, the oxides on the surface of the metal wiring film 43 at the bottom of the groove or hole 45 are able to be removed in a similar manner to that observed when $H_2$ gas was used as the treatment gas.

In the vacuum treatment apparatus 10 shown in FIG. 1, the reference numeral 35 represents a system for supplying a raw material gas for forming a metal thin film, and following the removal of oxides from the surface of the metal wiring film 43, a conductive film (such as, a metal thin film) can be grown on the surface of the object 40 by introducing the raw material gas from the raw material gas supply system 35, with the apparatus maintained in a state of vacuum.

Figure 3:
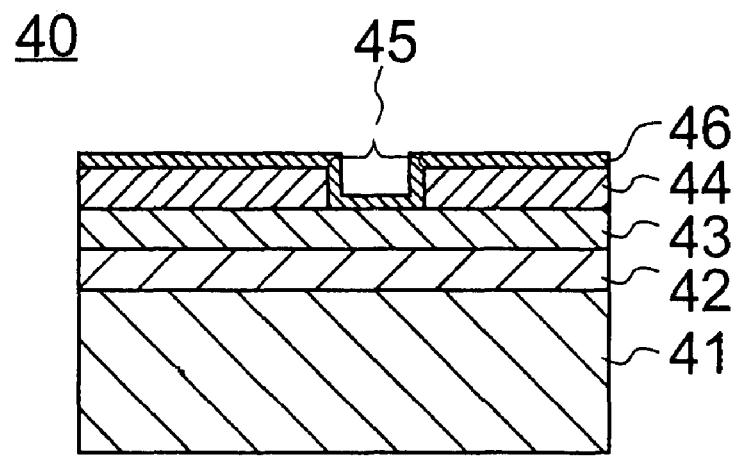
FIG. 3 is a cross-sectional view showing a thin film formed on the object of FIG. 2.

The reference numeral 46 in FIG. 3 shows this metal thin film, and the inside of the groove or hole 45 is also coated with this metal thin film 46. In those cases where a tantalum thin film is grown as the metal thin film 46, an organic metal source (such as, TIMATA ($Ta[NC(CH_3)_2C_2H_5][N(CH_3)_2]_3$) or PDMAT ($Ta[N(CH_3)_2]_5$)) can be used as the raw material gas.

The TIMATA or PDMAT is placed in a container that has been heated to 80° C., and by bubbling Ar gas through the material (such as, TIMATA or PDMAT) at an appropriately controlled flow rate, the raw material gas can be introduced into the vacuum chamber 11 together with Ar.

In order to prevent liquefaction of the TIMATA or PDMAT within the supply path, the piping and chamber are preferably heated to a temperature of 80 to 90° C.

In the above description, the cleaning treatment of the copper thin film and the subsequent formation of the metal thin film were conducted consecutively within a single vacuum chamber 11 with vacuum atmosphere maintained throughout. In other words, the object was not exposed to the atmosphere, but the treatments could also be conducted in separate vacuum chambers. In such cases, the object still needs to be maintained under vacuum atmosphere between the cleaning step and the subsequent metal thin film formation step of the present invention.

EXAMPLES OF THE FIRST ASPECT

Example 1

In the vacuum treatment apparatus 10 shown in FIG. 1, the reference numeral 35 denotes a system for supplying a raw material gas for forming a barrier film, and the raw material 38 for the barrier film is located inside a container 37.

The organometallic compound TIMATA ($Ta[NC(CH_3)_2C_2H_5][N(CH_3)_2]_3$) was used as the raw material 38, and by heating the container 37 to 80° C. to ensure the TIMATA is in a liquid state, and then bubbling a carrier gas through the TIMATA at an appropriately controlled flow rate, TIMATA gas was generated as the raw material gas, and passed through the piping 39 and introduced into the vacuum chamber 11. In this example, Ar gas with a flow rate of 100 sccm was used as the carrier gas.

The piping 39 and the vacuum chamber 11 were heated to a temperature of 80 to 90° C. to prevent the TIMATA from liquefying within the raw material supply path.

The current flowing through the hot plate 13 was then increased, and an object 40 that had undergone oxide removal in accordance with the method described above <pretreatment>was heated to 300 to 380° C. The raw material gas and the reactive gas were then introduced into the vacuum chamber 11 simultaneously, while the pressure within the chamber 11 was maintained at 2.0 Pa.

With the temperature of the catalyst 21 held at approximately 1700° C., the introduced reactive gas is decomposed on contact with the tungsten wire, thereby forming radicals. For example, if $NH_3$ gas is used as the reactive gas, NH and $NH_2$ radicals are generated.

Figure 12:
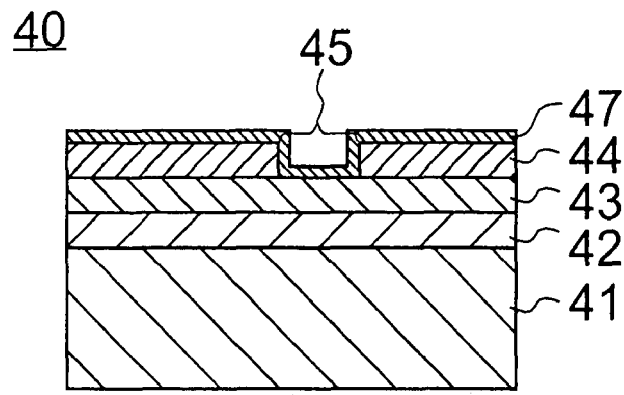
FIG. 12 is a cross-sectional view showing a metal thin film formed on an object in accordance with the first aspect of the present invention.

These radicals and the metal raw material gas TIMATA undergo a chemical vapor deposition reaction (CVD) on the surface of the heated object 40, as shown in FIG. 12. Consequently, a thin film 47 is formed on the surface of the insulating film 44 and the surface of the insulating film 44 exposed at the side face of the groove or hole 45, and the surface of the metal wiring film 43 that is exposed at the bottom of the groove or hole 45. The thin film 46 formed in this example is a $Ta_xN$ film, which functions as a barrier film for preventing the diffusion of the copper film formed on the surface of thin film 47.

In this example, $NH_3$ gas was used as the reactive gas, but $H_2$ gas, $SiH_4$ gas, $NH_2NH_2$ gas, or $H_2O$ gas could also be used. These gases can be used either singularly, or in mixtures comprising two or more different gases.

<Measurement Results>

Figure 4:
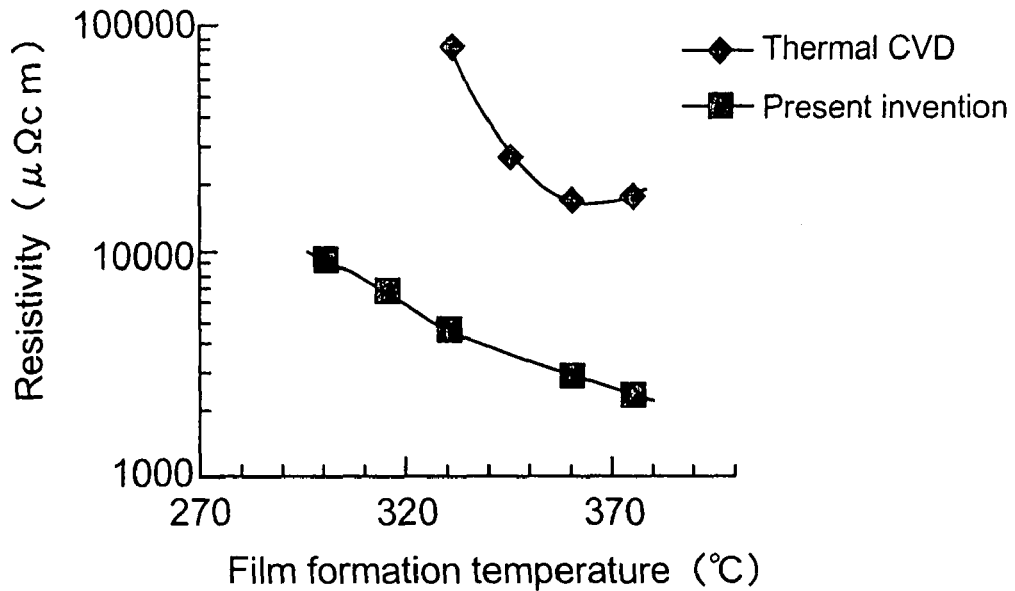
FIG. 4 is a graph showing the relationship between the film formation temperature and the resistivity for structures according to the first aspect of the present invention.

FIG. 4 is a graph showing the relationship between the resistivity of the $Ta_xN$ film and the temperature of the object, for the case of film formation conducted under the conditions of the present invention described above and for the case of film formation conducted without heating the catalyst 21, using method of conventional thermal CVD.

As shown in FIG. 4 it is evident that the resistivity decreases as the temperature increases for object temperatures up to 370° C. according to the method of the present invention.

In contrast, in the conventional thermal CVD method, even when the temperature of the object is increased, the resistivity of the TaN film falls only as far as 20,000 μΩcm.

Figure 5:
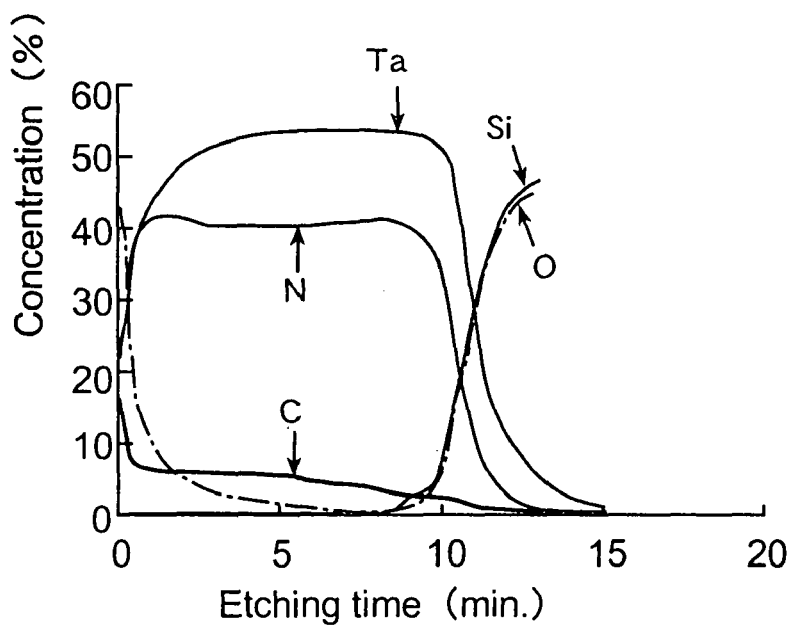
FIG. 5 is a graph showing the concentration of impurities through the thickness of a thin film formed in accordance with the first aspect of the present invention.
Figure 6:
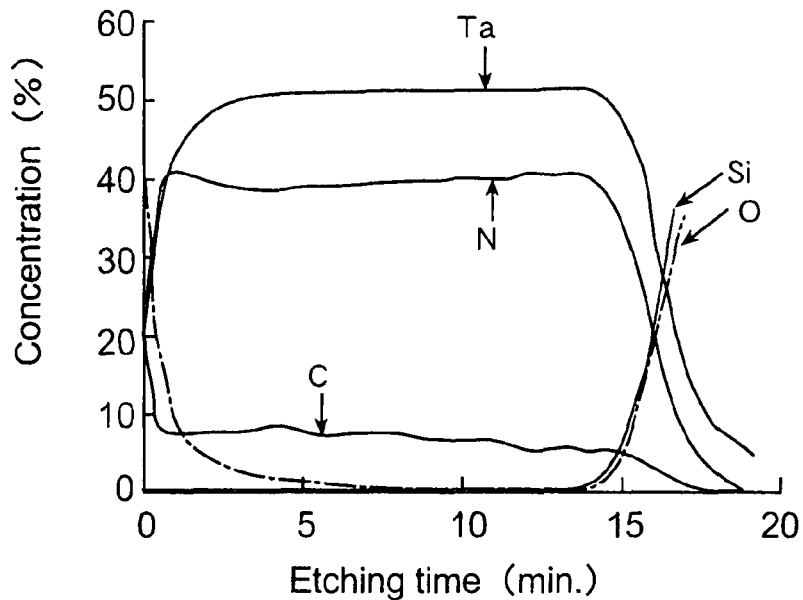
FIG. 6 is a graph showing the concentration of impurities through the thickness of a thin film formed using a conventional thermal CVD method.

FIG. 5 and FIG. 6 show the results for AES analysis of the TaN films formed using the above two methods when the object was heated to 350° C. In each figure, the horizontal axis represents the etching time; that is, the depth through the thickness of the film, and the vertical axis represents the concentration of the various atoms within the film. FIG. 5 shows the analysis results of a film formed using the method of the present invention; and FIG. 6 shows the analysis results of a film formed using a conventional thermal CVD method in which the catalyst was not heated. In these results, the TaN film of the present invention has a carbon content that is 2.4% lower than that of the conventional TaN film.

Figure 7:
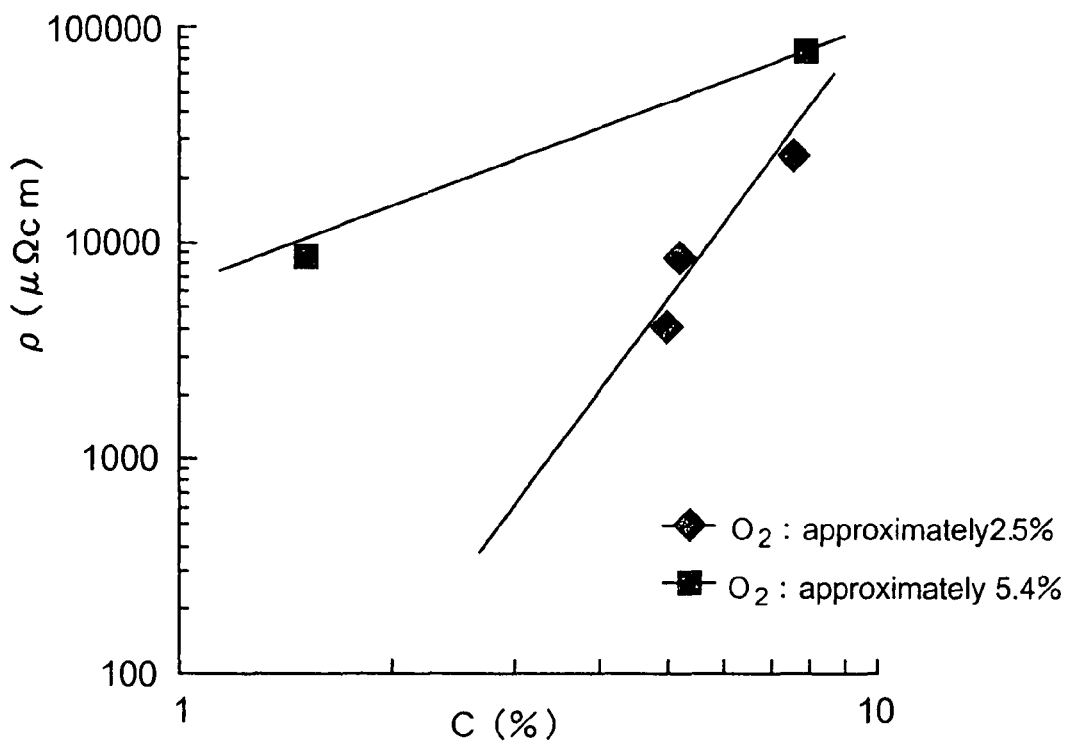
FIG. 7 is a graph showing the relationship between the ratio of the C atom content and the resistivity for a TaN film formed in accordance with the first aspect of the present invention.

FIG. 7 is a graph showing the relationship between the C atom content and the resistivity for TaN films of the present invention with $O_2$ content values of 2.5% and 5.4% respectively. From these results, it is clear that the resistivity decreases rapidly as the carbon content diminishes.

Accordingly, it is surmised that the reason the TaN film by the present invention denotes a lower resistivity than the TaN film formed by conventional thermal CVD is because of the reduced carbon content.

As described above, the present invention enables the formation of TaN films with superior film quality in comparison with films formed by conventional thermal CVD methods.

Example 2

However, from the graph shown in FIG. 4, it is clear that in order to achieve a TaN film with a resistivity of 2,200 μΩcm, the object must be heated to 375° C. Current Cu wiring processes now require process temperatures of 300° C. or less; that is, further temperature reductions are necessary.

In this example, the object is placed inside the vacuum chamber 11 with the vacuum chamber 11 undergoing continuous evacuation, and following heating of the catalyst 21. The raw material gas (TIMATA) and the reactive gas ($NH_3$ gas or $H_2$ gas) are introduced alternately into the vacuum chamber 11 while the evacuation and the heating of the catalyst 21 are continued.

Figure 8:
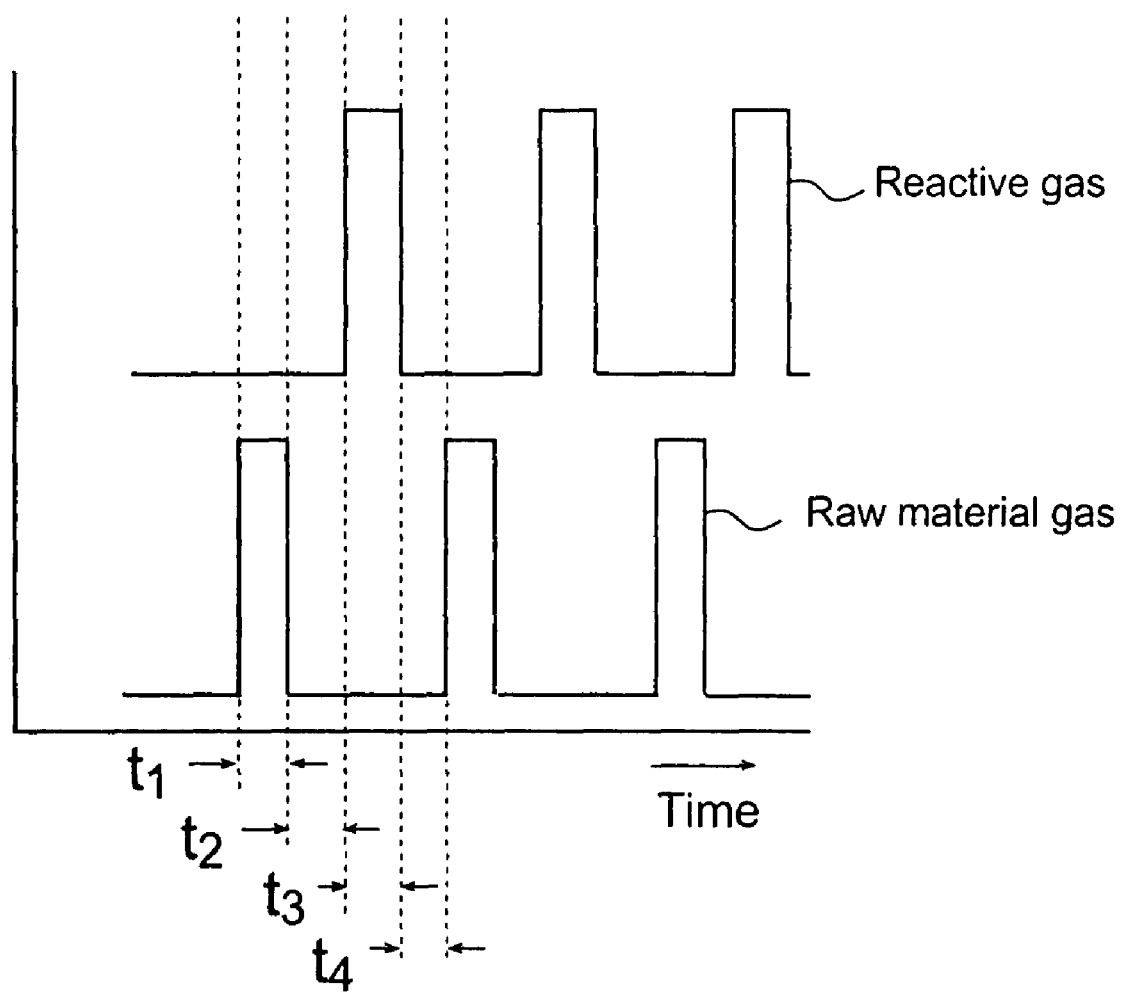
FIG. 8 is a gas supply timing chart according to the first aspect of the present invention.

FIG. 8 is a timing chart for the supply of each of the gases, wherein $t_1$ represents the raw material gas supply period, $t_2$ represents an evacuation period following halting of the raw material gas supply and before supply of the reactive gas is commenced, $t_3$ represents the reactive gas supply period, and $t_4$ represents an evacuation period following halting of the reactive gas supply and before supply of the raw material gas is recommenced.

During the raw material gas supply period $t_1$, no reactive gas is introduced, and during the reactive gas supply period $t_3$, no raw material gas is introduced.

Because the inside of the vacuum chamber 11 is evacuated continuously by the vacuum exhaust system, during those periods when supply of the raw material gas and supply of the reactive gas are halted, any residual gas within the vacuum chamber 11 is evacuated.

Figure 9:
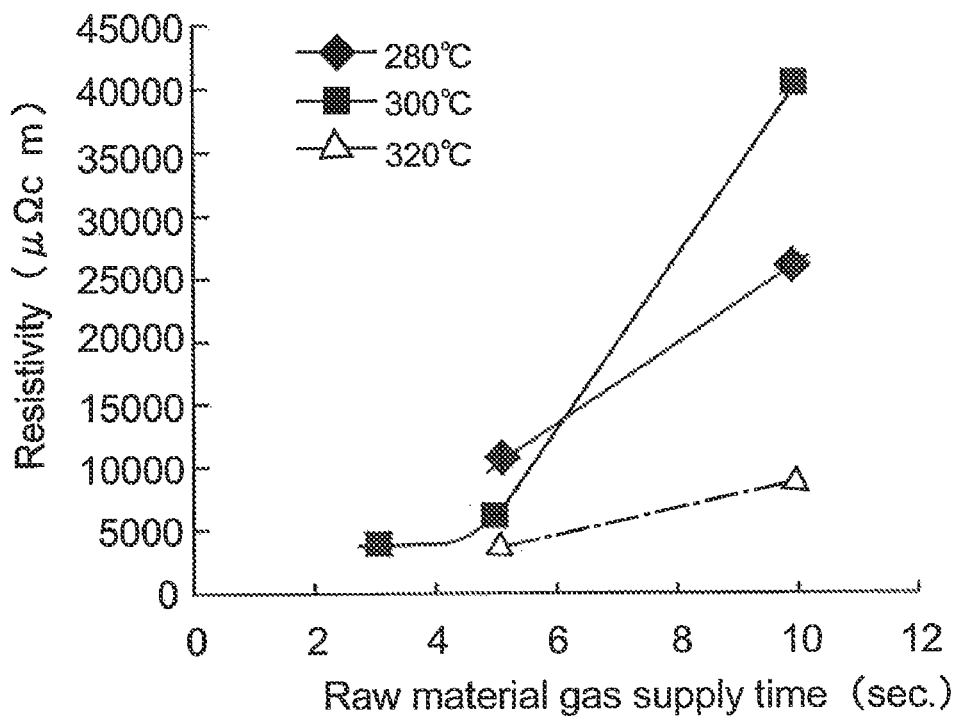
FIG. 9 is a graph showing the relationship between the raw material gas supply time and the resistivity of the formed TaN film according to the first aspect of the present invention.

The relationship between the raw material gas supply time $t_1$, and the resistivity of the produced TaN film is shown in FIG. 9.

The raw material gas supply time $t_1$, was varied from 3 to 10 seconds, the evacuation time $t_2$ following halting of the raw material gas supply and before commencement of the reactive gas supply was set to 5 seconds, the reactive gas supply time $t_3$ was set to 20 seconds, and the evacuation time $t_4$ following halting of the reactive gas supply and before recommencement of the raw material gas supply was set to 5 seconds.

Results were measured for the object temperatures of 280° C., 300° C., and 320° C. The other conditions were identical with the above-described conditions for example 1.

With one cycle defined as a single occurrence of each of the periods $t_1$ to $t_4$, a TaN film was formed by 150 cycles.

The results are shown in FIG. 9. The horizontal axis represents the raw material gas supply time, and the vertical axis represents the resistivity. It is evident that shorter raw material gas supply times result in lower resistivity values. It is believed that of the raw material gas adsorbed to the surface of the object, it is only the layer of atoms close to the object surface that actually undergoes reaction with the radicals. Because shorter raw material gas supply times result in a thinner layer of atoms adsorbed to the object surface within each cycle, it is surmised that the proportion of low resistance TaN that undergoes reaction with the radicals will be larger, thereby causing a reduction in the quantity of residual C, and resulting in a lower overall resistivity for the formed TaN film.

Accordingly, it is anticipated that shortening the length of the raw material gas supply period within each cycle will enable further reductions in the resistivity.

Example 3

Figure 10:
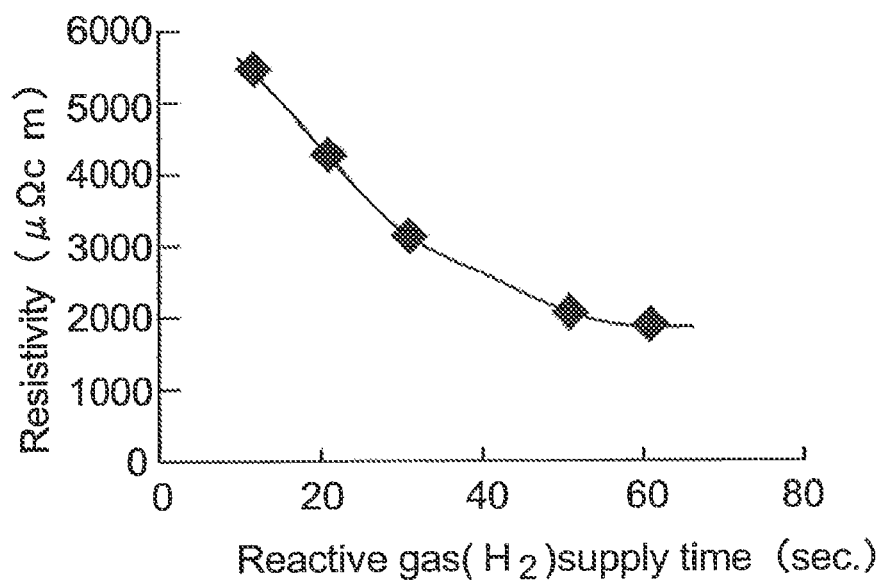
FIG. 10 is a graph showing the relationship between the reactive gas supply time and the resistivity of the thus formed TaN film.

FIG. 10 is a graph showing the relationship between the supply time $t_3$ for the reactive gas ($H_2$ gas) and the resistivity of the produced TaN film, under conditions including an object temperature of 300° C., a supply time $t_1$, for the raw material gas (TIMATA) of 3 seconds, and evacuation times $t_2$ and $t_4$ of 5 seconds.

A temperature of 300° C. is the upper temperature limit for a Cu wiring process, but it can be seen from the results shown in FIG. 10 that a resistivity value of 2,000 μΩcm was achievable even with the heating temperature of the object set to 300° C.

Figure 11:
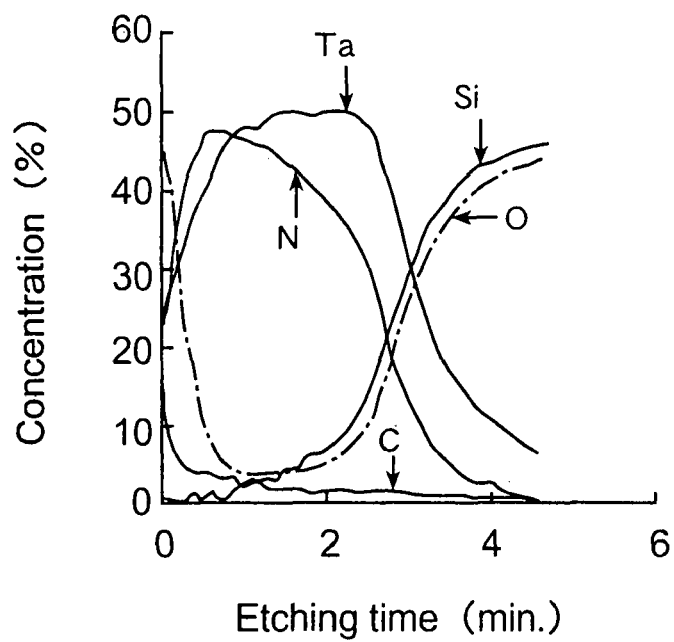
FIG. 11 is a graph showing the results of AES analysis of the TaN film.

FIG. 11 shows the results for an AES analysis of the thus formed TaN film. The carbon content, which is a cause of deterioration in the film quality, at approximately 1.5%, is significantly lower than that observed in films formed using conventional thermal CVD methods. This value is also considerably lower than the value shown in FIG. 5.

From the above results it is evident that the method of the present invention is able to satisfy the requirements of Cu wiring processes:
(1) a substrate temperature of no more than 300° C.,
(2) a high quality film with minimal carbon content, and
(3) favorable step coverage.

The description above focused on the formation of TaN films, but the present invention is not limited to the formation of TaN films, and can be widely used in any processes in which a thin film is formed on the surface of an object by introducing a raw material gas and a reactive gas into a vacuum atmosphere, thereby generating radicals by bringing the reactive gas into contact with a heated catalyst, and then effecting a chemical reaction of the raw material gas by thus generated radicals.

EXAMPLES FOR THE SECOND ASPECT

Reflectance can be used as an indicator of the cleanliness of a copper thin film surface. The reflectance is determined by irradiating a light beam of a certain wavelength onto the substrate surface, and then calculating the ratio of the intensity of the reflected light beam compared to the intensity of the incident light beam. The larger the reflectance value is, the closer the surface of the substrate is to a specular surface.

If the reflectance of the specular surface of a Si wafer is defined as 100%, then the surface of an oxide-free, clean copper thin-film has a reflectance of approximately 120% at a wavelength of 436 nm.

In order to measure the effectiveness of the present invention, the object 40 was replaced with a substrate in which the entire surface of the copper thin film was exposed, and the degree of oxide removal from the surface of the copper thin film was determined by the variation in the reflectance.

In a typical semiconductor device substrate, the surface of the copper thin film is almost free of oxides and the reflectance is nearly 120%, but in the present invention, substrates comprising a copper thin film with a reflectance of 15 to 20% were used for the examples.

Example 1

$H_2$ gas was used as the treatment gas, and conditions included a flow rate of 200 sccm, a chamber pressure of 65 Pa, and a treatment gas supply time of 60 seconds. Results were measured for substrate temperatures of 170° C., 230° C., and 270° C.

Comparative Example 1

For the purposes of comparison, no current was applied to the catalyst 21, and the treatment gas was introduced and the oxides on the surface of the copper thin film reduced with the substrate temperature set to 170° C., 230° C., 270° C., or 350° C. The other conditions were identical with the above-described conditions for example 1.

<Measurement Result 1>

Figure 13:
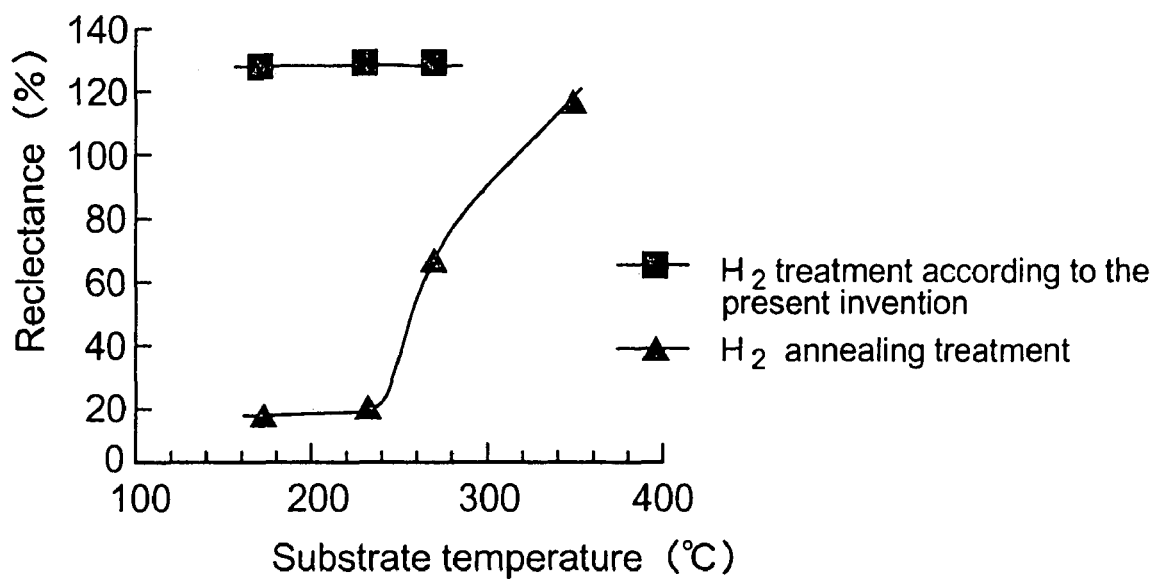
FIG. 13 is a graph showing the relationship between the substrate temperature and the reflectance of structures according to the second aspect of the present invention.

The results of the reflectance measurements are shown in FIG. 13. The horizontal axis represents the substrate temperature, and the vertical axis represents the reflectance.

FIG. 13 shows that a high reflectance of 125% is achievable even at a substrate temperature of 170° C. when the method of the present invention is used, whereas in the comparative example, the reflectance failed to reach 120% even when the substrate temperature was increased to 350° C.

These results indicate that the method of the present invention enables the oxide film on a copper thin film surface to be effectively removed even at lower temperatures, thereby exposing a clean copper surface. The method of the comparative example is unable to achieve effective cleaning of the copper thin film surface.

In a typical semiconductor manufacturing process, a copper thin film cleaning step that uses only $H_2$ gas and substrate heating requires the temperature of the object to be raised to approximately 300° C., whereas with the method of the present invention, this temperature can be reduced to approximately 200° C.

By using the method of the present invention, if the temperature of the object raised to approximately 300° C., an even cleaner copper thin film surface can be achieved than that treated at low temperatures.

Example 2

Next, substrates with the same initial reflectance value as the substrates used in the example 1 were transported into the vacuum chamber 11, subsequently treated at varying pressures, and the reflectance values then remeasured.

Conditions included a substrate temperature of 230° C., a $H_2$ gas flow rate of 200 sccm, a pressure inside the vacuum chamber 11 of 0.8 Pa, 10 Pa, or 65 Pa, and a treatment time of 60 seconds.

Measurement Result 2

Figure 14:
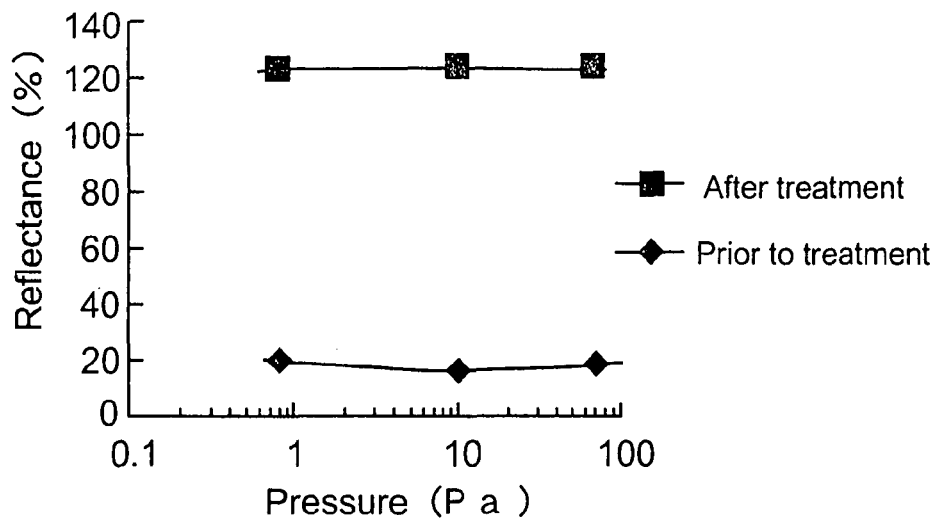
FIG. 14 is a graph showing the relationship between the pressure and the reflectance of structures according to the second aspect of the present invention.
Figure 15:
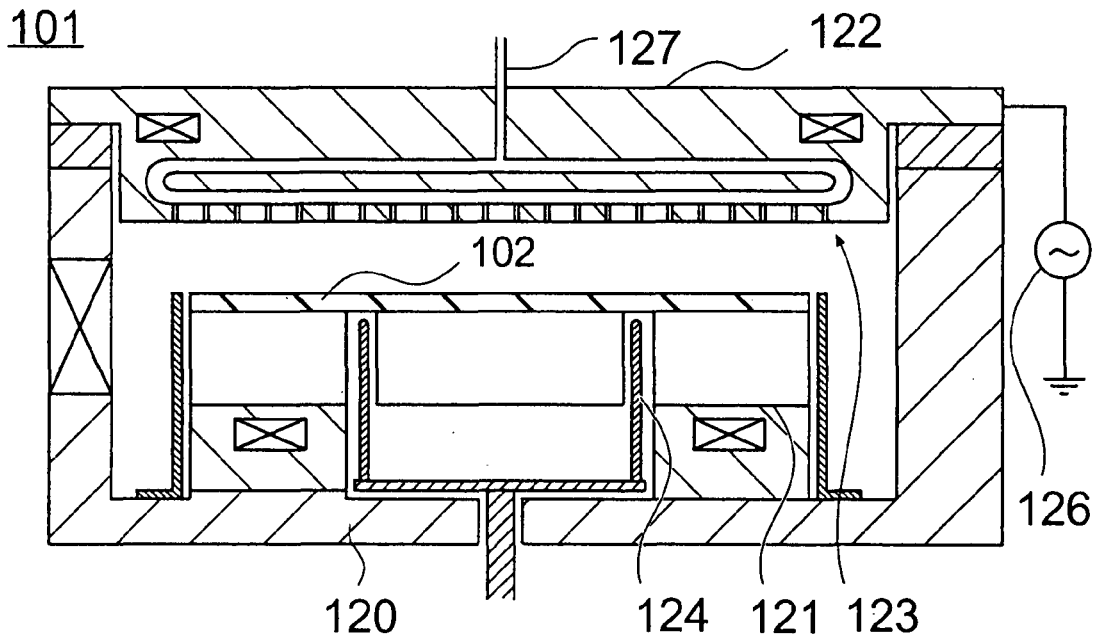
FIG. 15 is a conventional film formation apparatus.

The results of the reflectance measurements are shown in FIG. 14. The horizontal axis represents the treatment pressure, and the vertical axis represents the reflectance.

According to the results of measurements, it is clear that the cleaning of a copper thin film surface using the method of the present invention denotes very little pressure dependency.

When surface treatment is conducted using plasma, the plasma density decreases as the treatment pressure is lowered, thereby resulting in a significant decrease in the efficiency of the treatment. For example, if the pressure is depressed two orders of magnitude, then the plasma density also is decreased by two orders of magnitude.

In contrast, as shown in FIG. 14, in the case of the present invention, the fact that the surface cleaning efficiency is essentially unchanged even if the pressure varies two orders of magnitude. It indicates that the radical density is from 10 to 100-fold compared to that of plasma.

The description above focused mainly on the cleaning of copper thin film surfaces, but the potential cleaning of an object for the present invention are not restricted copper thin films. The invention can be widely used for the cleaning of thin films formed from materials, such as, TiN, Al or Si crystals or the like, including surface of the conductive materials formed from such materials. The present invention is particularly suitable for the cleaning of conductive materials or thin film surfaces exposed at the bottom of fine grooves or holes provided in insulating films.

What is claimed is:

1. A method of manufacturing a thin film comprising:
   transporting an object to be treated into a vacuum atmosphere in which a catalyst is disposed inside a vacuum chamber with one face for the object to be treated facing the catalyst,
   performing a raw material gas introduction step and a reactive gas introduction step,
   wherein the raw material gas introduction step comprises introducing raw material gas into the vacuum chamber,
   wherein the reactive gas introduction step comprises introducing a reactive gas including a hydrogen atom in its chemical structure into the vacuum chamber during a time when the introduction of the raw material gas is halted, and bringing the reactive gas into contact with the catalyst through which an electronic current is flowed to heat to a temperature at which radicals are generated from the reactive gas,
   wherein the raw material gas introduction step and the reactive gas introduction step are performed alternately so as to form a thin film on the surface of the object to be treated by the radicals and the raw material gas undergoing a chemical vapor deposition reaction on the object to be treated positioned in the vacuum atmosphere inside the vacuum chamber, wherein the raw material gas is Ta[NC(CH$_3$)$_2$C$_2$H$_5$][N(CH$_3$)$_2$]$_3$, and wherein a metallic film having Ta is formed as the thin film.

2. The method of manufacturing a thin film according to claim 1, further comprising a step of:

a raw material gas evacuation step of evacuating the inside of the vacuum chamber during a time in which the introduction of both the raw material gas and the reactive gas is halted, after the raw material gas introduction step, and prior to the reactive gas introduction step.

3. The method of manufacturing a thin film according to claim 2, wherein the temperature at which the radicals are generated from the reactive gas during the reactive gas introduction step is 1,500 to 2,000° C.

4. The method of manufacturing a thin film according to claim 1, further comprising the step of:

a reactive gas evacuation step of evacuating the inside of the vacuum chamber during a time in which the introduction of both the raw material gas and the reactive gas is halted, after the reactive gas introduction step, prior to returning to the raw material gas introduction step.

5. The method of manufacturing a thin film according to claim 4, wherein the temperature at which the radicals are generated from the reactive gas during the reactive gas introduction step is 1,500 to 2,000° C.

6. The method of manufacturing a thin film according to claim 1, wherein the reactive gas is one or more gases selected from the group consisting of H$_2$ gas, NH$_3$ gas, SiH$_4$ gas, NH$_2$NH$_2$ gas, and H$_2$O gas.

7. The method of manufacturing a thin film according to claim 6, wherein the temperature at which the radicals are generated from the reactive gas during the reactive gas introduction step is 1,500 to 2,000° C.

8. The method of manufacturing a thin film according to claim 1, wherein a metal wiring film is exposed on at least a part of the surface of the object, and a thin film is formed on the exposed metal wiring film.

9. The method of manufacturing a thin film according to claim 8, wherein an insulating film is disposed on the metal wiring film, and the thin film is formed on the metal wiring film exposed at the bottom of a hole formed in the insulating film.

10. The method of manufacturing a thin film according to claim 9, wherein the temperature at which the radicals are generated from the reactive gas during the reactive gas introduction step is 1,500 to 2,000° C.

11. The method of manufacturing a thin film according to claim 8, wherein the temperature at which the radicals are generated from the reactive gas during the reactive gas introduction step is 1,500 to 2,000° C.

12. The method of manufacturing a thin film according to claim 1, wherein a pretreatment step is conducted prior to the formation of the thin film, and the raw material gas introduction step and the reaction gas are performed alternately, the pretreatment step comprising the steps of:

introducing the reactive gas into the vacuum chamber without introducing the raw material gas during the catalyst in a heated state, and bringing the reactive gas into contact with the catalyst.

13. The method of manufacturing a thin film according to claim 12, wherein the temperature at which the radicals are generated from the reactive gas during the reactive gas introduction step is 1,500 to 2,000° C.

14. The method of manufacturing a thin film according to claim 1, wherein the temperature at which the radicals are generated from the reactive gas during the reactive gas introduction step is 1,500 to 2,000° C.

\* \* \* \* \*